(12) United States Patent
Chadha et al.

(10) Patent No.: US 11,936,379 B2
(45) Date of Patent: Mar. 19, 2024

(54) DIGITAL DELAY LINE CALIBRATION WITH DUTY CYCLE CORRECTION FOR HIGH BANDWIDTH MEMORY INTERFACE

(71) Applicant: NVIDIA CORPORATION, Santa Clara, CA (US)

(72) Inventors: Ish Chadha, San Jose, CA (US); Virendra Kumar, Mountain View, CA (US); Abhijith Kashyap, San Francisco, CA (US); Vipul Katyal, San Jose, CA (US); Hao-Yi Wei, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 147 days.

(21) Appl. No.: 17/841,504

(22) Filed: Jun. 15, 2022

(65) Prior Publication Data

US 2023/0163764 A1 May 25, 2023

Related U.S. Application Data

(60) Provisional application No. 63/281,935, filed on Nov. 22, 2021.

(51) Int. Cl.
*H03K 19/1776* (2020.01)
*H03K 19/003* (2006.01)
*H03K 19/173* (2006.01)
*H03K 19/17736* (2020.01)
*H03K 19/17784* (2020.01)

(52) U.S. Cl.
CPC ... *H03K 19/1776* (2013.01); *H03K 19/00323* (2013.01); *H03K 19/1737* (2013.01); *H03K 19/1774* (2013.01); *H03K 19/17784* (2013.01)

(58) Field of Classification Search
None
See application file for complete search history.

(56) References Cited

U.S. PATENT DOCUMENTS

| | | | | |
|---|---|---|---|---|
| 8,154,331 B2* | 4/2012 | Kim | ........... | H03K 5/1565 327/175 |
| 2005/0278121 A1* | 12/2005 | Tabarovsky | ........... | G01V 3/28 702/9 |
| 2008/0054958 A1* | 3/2008 | Liu | ........... | H03L 7/0814 327/149 |
| 2021/0203340 A1* | 7/2021 | Shi | ........... | H03L 7/0814 |

* cited by examiner

*Primary Examiner* — Anh Q Tran
(74) *Attorney, Agent, or Firm* — Artegis Law Group, LLP (57) ABSTRACT

Embodiments include a memory device with an improved calibration circuit. Memory device input/output pins include delay lines for adjusting the delay in each memory input/output signal path. The delay adjustment circuitry includes digital delay lines for adjusting this delay. Further, each digital delay line is calibrated via a digital delay line locked loop which enables adjustment of the delay through the digital delay line in fractions of a unit interval across variations due to differences in manufacturing process, operating voltage, and operating temperature. The disclosed techniques calibrate the digital delay lines by measuring both the high phase and the low phase of the clock signal. As a result, the disclosed techniques compensate for duty cycle distortion by combining the calibration results from both phases of the clock signal. The disclosed techniques thereby result in lower calibration error relative to approaches that measure only one phase of the clock signal.

20 Claims, 5 Drawing Sheets

DIGITAL DELAY LINE CALIBRATION WITH DUTY CYCLE CORRECTION FOR HIGH BANDWIDTH MEMORY INTERFACE

CROSS-REFERENCE TO RELATED APPLICATIONS

This application claims priority benefit of the United States Provisional Patent Application titled, "DIGITAL DELAY LINE CALIBRATION WITH DUTY CYCLE CORRECTION FOR HIGH BANDWIDTH MEMORY INTERFACE," filed on Nov. 22, 2021 and having Ser. No. 63/281,935. The subject matter of this related application is hereby incorporated herein by reference.

BACKGROUND

Field of the Various Embodiments

Various embodiments relate generally to computer memory systems and, more specifically, to digital delay line calibration with duty cycle correction for high bandwidth memory interface.

Description of the Related Art

A computer system generally includes, among other things, one or more processing units, such as central processing units (CPUs) and/or graphics processing units (GPUs), and one or more memory systems. One type of memory system is referred to as system memory, which is accessible to both the CPU(s) and the GPU(s). Another type of memory system is graphics memory, which is typically accessible only by the GPU(s). These memory systems comprise multiple memory devices. Memory systems for high-performance computer systems often include high-bandwidth memory (HBM) systems for at least a portion of the memory accessible by one or more processors, such as the CPU(s), the GPU(s), and/or the like. The memory devices employed in HBM systems are referred to herein as HBM dynamic random-access memory (DRAM) devices. Successive generations of HBM memory systems generally increase in speed and performance. As one example, the HBM3 interface operates at approximately two times the frequency of earlier generation HBM systems. At higher operating frequencies, such as with HBM3 systems, the interfaces between HBM DRAM and the processor(s) undergo interface training. This interface training is performed in order to meet more strict timing requirements associated with higher operating frequencies of the communications channel between HBM DRAM and the processor(s). Interface training also accommodates timing variations resulting from process, voltage, and/or temperature (PVT) variations. This interface training ensures that each data I/O signal is captured by the memory device on the same edge of the clock signal.

Interface training includes read interface training and write interface training and involves changing the timing of read data or write data to be stable at the time of the clock signal that samples the read data or write data. This stable portion of the read data or write data has the appearance of an eye pattern on a signal analysis device. Therefore, changing the timing of read data or write data to be stable at the time of the clock signal is referred to herein as eye centering. To avoid area and power overhead on the die of HBM DRAM devices, eye centering is performed by the GPU or other processor. Eye centering involves adjusting a delay in the memory input/output (I/O) signal path. The delay adjustment circuitry includes digital delay lines for delay adjustment that is less than or equal to one unit interval (UI) and barrel shifters for delay adjustment that is more than one unit interval (in unit interval increments). In some examples, a unit interval is one-half the period of the reference clock signal of the system.

With HBM systems, each HBM DRAM device has a large number of data I/O pins, such as 1024 data I/O pins, and each data I/O pin has a separate, independently controllable delay element, where each delay element includes a digital delay line. In some examples, HBM DRAM devices have 16 times the number of data I/O pins as compared to GDDR memory devices and/or LPDDR memory devices.

Digital delay lines enable lower power consumption relative to other implementations, such as analog delay lines. These digital delay lines are calibrated to adjust for PVT variations. This calibration is achieved via a digital delay line locked loop (DDLL) which enables adjustment of the delay through a corresponding digital delay line in fractions of a unit interval across PVT variations. These PVT variations can cause variance of the period or duration of the clock cycle. Therefore, the DDLL can be configured to measure the high phase of the clock cycle. The delay through the digital delay line is adjusted based on the measurement of the high phase of the clock cycle. Alternatively, the DDLL can be configured to measure the low phase of the clock cycle. The delay through the digital delay line is adjusted based on the measurement of the low phase of the clock cycle.

One problem with this approach is that calibrating a digital delay line for only one phase of the clock signal is inaccurate when the duty cycle of the clock signal is not 50%. The duty cycle of the clock signal can vary from 50% due to aberrations such as duty cycle distortion (DCD). Systemic duty cycle distortion in clock signals can, in some circumstances, lead to DDLL lock inaccuracies. For example, the reference clock signal can have a high phase that is 40% of the clock signal period and a low phase that is 60% of the clock signal period. If the DDLL is configured to measure the high phase of the clock cycle, then the DDLL can determine that the unit interval is 40% of the clock cycle period rather than 50%. Similarly, if the DDLL is configured to measure the low phase of the clock cycle, then the DDLL can determine that the unit interval is 60% of the clock cycle period rather than 50%. In both cases, this error in determining the unit interval leads to calibration inaccuracies. These calibration inaccuracies can reduce timing margin from the overall signal channel of the data I/O pins. Because timing margin is more critical as the frequency of the signal channel increases, these inaccuracies lead to reduced operating speeds for high performance HBM DRAM memory devices in order to ensure reliable memory read operations and write operations.

Comparable duty cycle distortion correcting techniques exist using analog delay line locked loops, which include analog delay lines, analog charge pumps, and/or the like. However, such analog systems generally consume more die area and power relative to digital approaches. Given the large number of signals to support the data 10 pins in HBM DRAM devices, analog delay line locked loops consume an unfeasible amount of die area and power.

As the foregoing illustrates, what is needed in the art are more effective techniques for compensating for duty cycle distortion in memory devices.

SUMMARY

Various embodiments of the present disclosure set forth a computer-implemented method for calibrating a delay line for a memory device. The method includes selecting a first phase of a reference clock signal. The method further includes determining, via the delay line, a first calibration value based on the first phase of the reference clock. The method further includes selecting a second phase of the reference clock signal. The method further includes determining, via the delay line, a second calibration value based on the second phase of the reference clock. The method further includes combining the first calibration value and the second calibration value to generate a third calibration value for the digital delay line.

Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, both phases of the clock signal are measured when the delay lines for the I/Os of the memory device are adjusted. As a result, the calibration of the delay lines is based on a more accurate measurement of the full clock cycle period relative to prior techniques, even when the clock cycle is subject to duty cycle distortion. Because the calibration of the memory device is more accurate, the memory device can operate at higher speeds, leading to improved memory performance relative to prior techniques. Another technical advantage of the disclosed techniques is that digital delay lines spanning one unit interval can be employed to track the clock signal across two unit intervals. As a result, the die area and power consumption are reduced relative to implementations with digital delay lines spanning two unit intervals. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
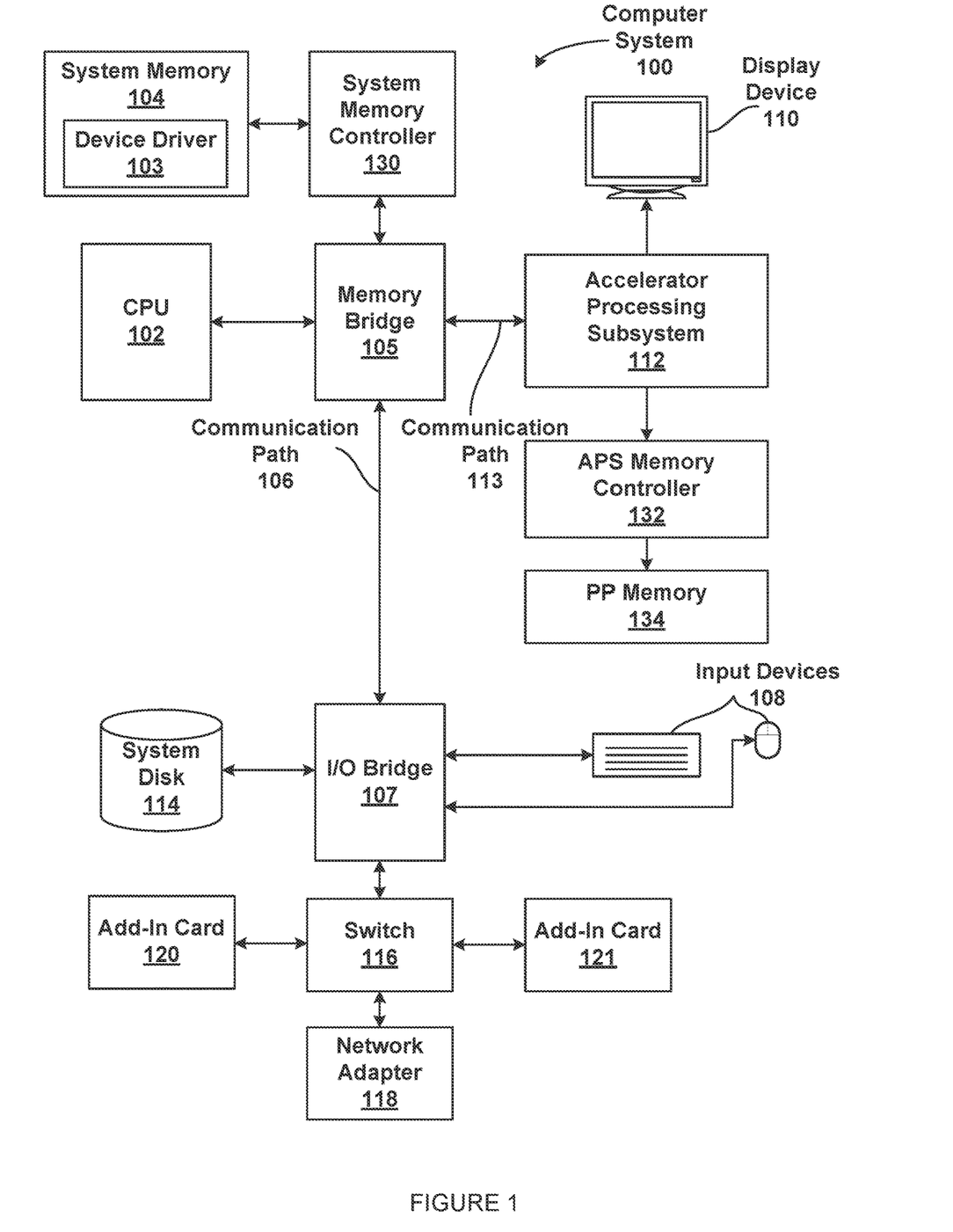
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to an accelerator processing subsystem 112 via a memory bridge 105 and a communication path 113. Memory bridge 105 is coupled to system memory 104 via a system memory controller 130. Memory bridge 105 is further coupled to an I/O (input/output) bridge 107 via a communication path 106, and I/O bridge 107 is, in turn, coupled to a switch 116. Accelerator processing subsystem 112 is coupled to parallel processing memory 134 via an accelerator processing subsystem (APS) memory controller 132.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and accelerator processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high-definition DVD), or other magnetic, optical, or solid-state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, Peripheral Component Interconnect Express (PCIe), AGP (Accelerated Graphics Port), HyperTransport, or any other bus or point-to-point communication protocol known in the art.

In some embodiments, accelerator processing subsystem 112 comprises a graphics subsystem that delivers pixels to a display device 110 that may be any conventional cathode ray tube, liquid crystal display, light-emitting diode display, and/or the like. In such embodiments, accelerator processing subsystem 112 incorporates circuitry optimized for graphics and video processing, including, for example, video output circuitry. Such circuitry may be incorporated across one or more accelerators included within accelerator processing subsystem 112. An accelerator includes any one or more processing units that can execute instructions such as a central processing unit (CPU), a parallel processing unit (PPU), a graphics processing unit (GPU), an intelligence processing unit (IPU), neural processing unit (NAU), tensor processing unit (TPU), neural network processor (NNP), a data processing unit (DPU), a vision processing unit (VPU), an application specific integrated circuit (ASIC), a field-programmable gate array (FPGA), and/or the like.

In some embodiments, accelerator processing subsystem 112 incorporates circuitry optimized for general purpose and/or compute processing. Again, such circuitry may be incorporated across one or more accelerators included within accelerator processing subsystem 112 that are configured to perform such general purpose and/or compute operations. In yet other embodiments, the one or more accelerators included within accelerator processing subsystem 112 may be configured to perform graphics processing, general purpose processing, and compute processing operations. System memory 104 includes at least one device driver 103 configured to manage the processing operations of the one or more accelerators within accelerator processing subsystem 112.

In various embodiments, accelerator processing subsystem 112 may be integrated with one or more other elements of FIG. 1 to form a single system. For example, accelerator processing subsystem 112 may be integrated with CPU 102 and other connection circuitry on a single chip to form a system on chip (SoC).

In operation, CPU 102 is the master processor of computer system 100, controlling and coordinating operations of other system components. In particular, CPU 102 issues commands that control the operation of accelerators within accelerator processing subsystem 112. In some embodiments, CPU 102 writes a stream of commands for accelerators within accelerator processing subsystem 112 to a data structure (not explicitly shown in FIG. 1) that may be located in system memory 104, PP memory 134, or another storage location accessible to both CPU 102 and accelerators. A pointer to the data structure is written to a pushbuffer to initiate processing of the stream of commands in the data structure. The accelerator reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

Each accelerator includes an I/O (input/output) unit that communicates with the rest of computer system 100 via the communication path 113 and memory bridge 105. This I/O unit generates packets (or other signals) for transmission on communication path 113 and also receives all incoming packets (or other signals) from communication path 113, directing the incoming packets to appropriate components of the accelerator. The connection of accelerators to the rest of computer system 100 may be varied. In some embodiments, accelerator processing subsystem 112, which includes at least one accelerator, is implemented as an add-in card that can be inserted into an expansion slot of computer system 100. In other embodiments, the accelerators can be integrated on a single chip with a bus bridge, such as memory bridge 105 or I/O bridge 107. Again, in still other embodiments, some or all of the elements of the accelerators may be included along with CPU 102 in a single integrated circuit or system of chip (SoC).

CPU 102 and accelerators within accelerator processing subsystem 112 access system memory via a system memory controller 130. System memory controller 130 transmits signals to the memory devices included in system memory 104 to initiate the memory devices, transmit commands to the memory devices, write data to the memory devices, read data from the memory devices, and/or the like. One example memory device employed in system memory 104 is double-data rate SDRAM (DDR SDRAM or, more succinctly, DDR). DDR memory devices perform memory write and read operations at twice the data rate of previous generation single data rate (SDR) memory devices. In some examples, HBM DDR memory devices can be employed in system memory and/or other memory systems accessible by CPU 102.

In addition, accelerators and/or other components within accelerator processing subsystem 112 access PP memory 134 via an accelerator processing subsystem (APS) memory controller 132. APS memory controller 132 transmits signals to the memory devices included in PP memory 134 to initiate the memory devices, transmit commands to the memory devices, write data to the memory devices, read data from the memory devices, and/or the like. One example memory device employed in PP memory 134 is HBM DRAM. Compared with DDR memory devices, HBM DRAM memory devices are configured with a higher speed I/O interface and a wider data bus, in order to transfer more data bits with each memory write and read operation. By employing a high speed interface and a wider data bus, HBM DRAM memory devices are able to achieve the high data transfer rates typically needed by accelerators.

It will be appreciated that the system shown herein is illustrative and that variations and modifications are possible. The connection topology, including the number and arrangement of bridges, the number of CPUs 102, and the number of accelerator processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, accelerator processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

It will be appreciated that the core architecture described herein is illustrative and that variations and modifications are possible. Among other things, the computer system 100 of FIG. 1, may include any number of CPUs 102, accelerator processing subsystems 112, or memory systems, such as system memory 104 and parallel processing memory 134, within the scope of the disclosed embodiments. Further, as used herein, references to shared memory may include any one or more technically feasible memories, including, without limitation, a local memory shared by one or more accelerators within accelerator processing subsystem 112, memory shared between multiple accelerator processing subsystems 112, a cache memory, parallel processing memory 134, and/or system memory 104. Please also note, as used herein, references to cache memory may include any one or more technically feasible memories, including, without limitation, an L1 cache, an L1.5 cache, and L2 caches. In view of the foregoing, persons of ordinary skill in the art will appreciate that the architecture described in FIG. 1 in no way limits the scope of the various embodiments of the present disclosure.

Calibrating a Digital Delay Line for a Memory Device

Various embodiments include an improved calibration circuit for a memory device, such as an HBM DRAM device. Memory device I/Os include delay lines for adjusting the delay in the memory I/O signal path. The delay adjustment circuitry includes digital delay lines for adjusting this delay. Further, each digital delay line is calibrated via a digital delay line locked loop (DDLL) which enables adjustment of the delay through the digital delay line in fractions of a unit interval across PVT variations. The disclosed techniques calibrate the digital delay lines by measuring both the high phase and the low phase of the clock signal. As a result, the disclosed techniques compensate for duty cycle distortion by combining the calibration results from both phases of the clock signal.

Figure 2:
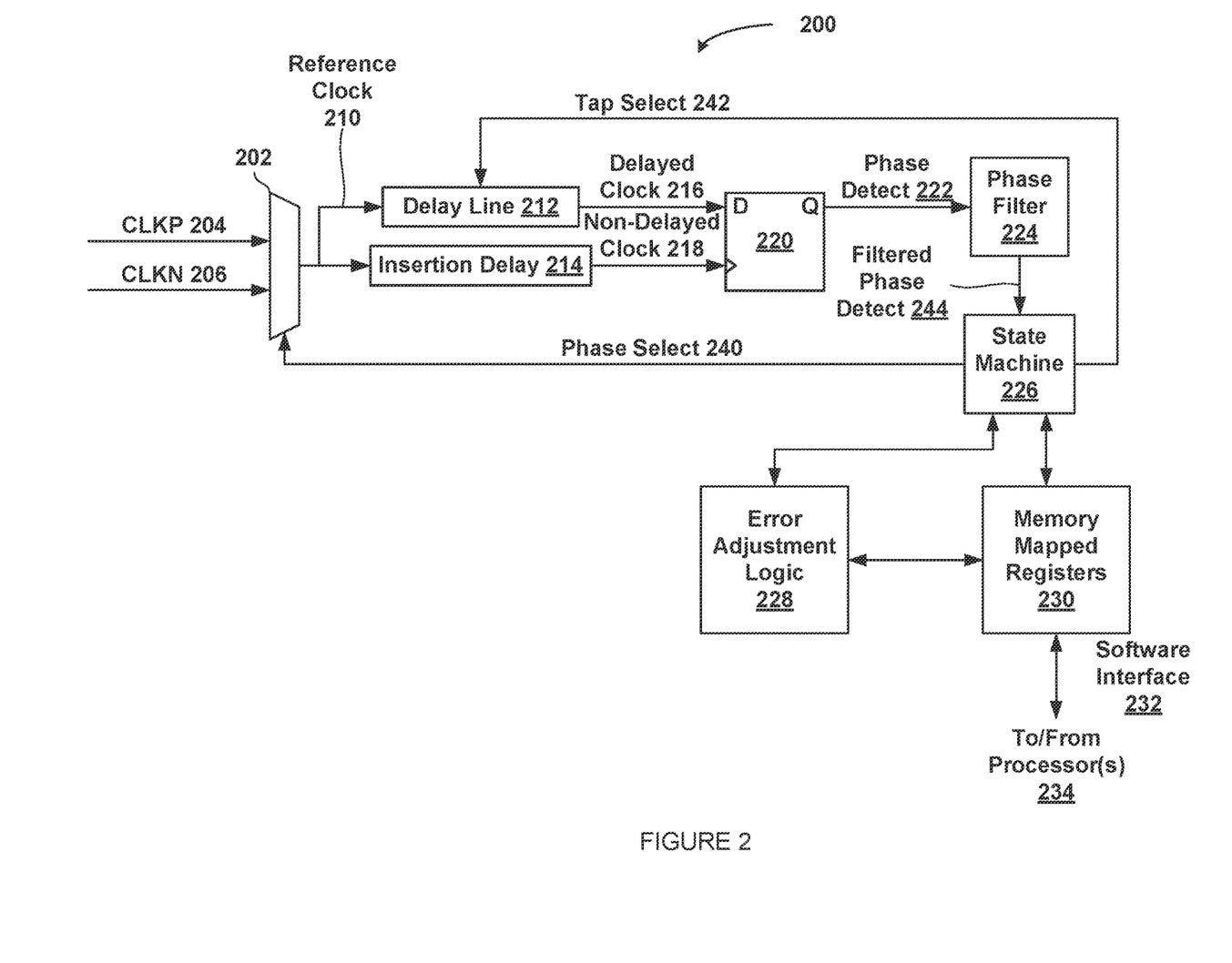
FIG. 2 is a block diagram of a calibration circuit for a memory device included in system memory and/or parallel processing memory of the computer system of FIG. 1, according to various embodiments.

FIG. 2 is a block diagram of a calibration circuit 200 for a memory device included in system memory and/or parallel processing memory of the computer system 100 of FIG. 1, according to various embodiments. As shown, calibration circuit 200 includes, without limitation, a multiplexor 202, a delay line 212, an insertion delay 214 element, a D flip-flop 220, a phase filter 224, a state machine 226, error adjustment logic 228, and memory mapped registers 230.

In operation, multiplexor 202 selects the input clock signal CLKP 204 or the inverted input clock signal CLKN 206 based on the phase select 240 signal. In some examples, the input clock signal CLKP 204 and the inverted input clock signal CLKN 206 are two phases of a system clock signal generated by a phase locked loop (PLL) and/or other suitable clock signal generator. The inverted input clock signal CLKN 206 is a logical inversion of the input clock signal CLKP 204. State machine 226 transmits the phase select 240 signal to multiplexor 202 with a logic level that is based on which phase of the clock signal that calibration circuit 200 is currently measuring. If calibration circuit 200 is currently measuring the high phase of the clock signal, then state machine 226 transmits the phase select 240 signal with a logic level that selects the input clock signal CLKP 204. If, on the other hand, calibration circuit 200 is currently measuring the low phase of the clock signal, then state machine 226 transmits the phase select 240 signal with a logic level that selects the inverted input clock signal CLKN 206. Multiplexor 202 transmits the selected clock signal as the reference clock 210 signal.

Delay line 212 delays the reference clock 210 signal received from multiplexor 202. The amount of delay through delay line 212 is based on a tap select 242 signal transmitted by state machine 226 to delay line 212. The tap select 242 signal can be a digital value that indicates a number of N taps, where each tap represents 1/N times the unit interval. In some examples, the tap select 242 signal can be a 6-bit digital value that varies from 0 to 63, where the tap select 242 signal indicates the number of taps of delay through delay line 212. A tap select 242 signal of 1 indicates 1 tap of delay, a tap select 242 signal of 2 indicates 2 taps of delay, a tap select 242 signal of 3 indicates 3 taps of delay, and so on. When the tap select 242 signal is 0, there are no taps of delay. Instead, the only delay is the insertion delay of delay line 212. This insertion delay of delay line 212 is designated as $I_D$. Delay line 212 generates a delayed clock 216 signal that represents the reference clock 210 signal as delayed by the number of taps indicated by the tap select 242 signal and the insertion delay of delay line 212.

Insertion delay 214 element represents the insertion delay on the non-delayed path. This insertion delay is designated as $I_N$. Insertion delay 214 element generates a non-delayed clock 218 signal that represents the reference clock 210 signal as delayed by the insertion delay on the non-delayed path.

D flip-flop 220 acts as a phase detector for calibration circuit 200. The data (D) input of D flip-flop 220 is the delayed clock 216 signal generated by delay line 212. The clock input of D flip-flop 220 is the non-delayed clock 218 signal generated by insertion delay 214 element. D flip-flop 220 generates a phase detect 222 signal by sampling the delayed clock 216 signal on a transition of the non-delayed clock 218 signal. The transition can be the rising edge of the non-delayed clock 218 signal or the falling edge of the non-delayed clock 218 signal. State machine 226 modifies the tap select 242 signal during calibration to sample the delayed clock 216 signal with various tap delays through delay line 212.

Phase filter 224 samples the phase detect 222 signal multiple times. In some examples, the number of samples and the filter function is programmable via the software interface 232. Phase filter 224 generates a filtered phase detect 244 signal by applying a filter function to a set of samples of the phase detect 222 signal, where the phase detect 222 signal is a sample of the delayed clock 216 signal. The function can be an arithmetic average function, a weighted average function, a geometric average function, and/or other filtering functions on the samples of the phase detect 222 signal. Phase filter 224 generates the filtered phase detect 244 signal in order to reduce the effects of spurious signals, noise, and/or the like in the phase detect 222 signal. Phase filter 224 transmits the filtered phase detect 244 signal to state machine 226.

State machine 226 controls the components of calibration circuit 200 through two iterations in order to calibrate delay line 212, one iteration for each phase of the reference clock 210 signal. In a first iteration, state machine 226 transmits the phase select 240 signal with a logic level that selects the input clock signal CLKP 204. In a second iteration, state machine 226 transmits the phase select 240 signal with a logic level that selects the inverted input clock signal CLKN 206.

During each iteration, state machine 226 changes the tap select 242 signal over a number of cycles of the reference clock 210 signal in order to select a different number of taps for delay line 212. For each different number of taps, state machine 226 determines the value of the tap select 242 signal when the filtered phase detect 244 signal transitions from a low level to a high level. Likewise, state machine 226 determines the value of the tap select 242 signal when the filtered phase detect 244 signal transitions from a high level to a low level. State machine 226 determines a calibration value in the form of a trim code delay of the clock phase being tested in the current iteration based on these two values of the tap select 242 signal. After state machine 226 completes the two iterations, state machine determines a composite calibration value in the form of a composite trim code delay by applying a function to the trim code delays determined from the two iterations. The function to determine the composite trim code delay can be based on a simple average of the trim code delays for the two phases, a weighted average of the trim code delays, a geometric mean of the trim code delays, and/or the like. In some examples, the function is programmable via the software interface 232. Because the composite trim code delay is based on trim code delays for both phases of the clock signal, the error term due to duty cycle distortion is reduced, relative to techniques that calibrate for only one phase of the clock cycle.

Error adjustment logic 228 assists state machine 226 in the calibration process, including, without limitation, changing the tap select 242 signal over a number of cycles of the reference clock 210 signal, determining the value of the tap select 242 signal when the filtered phase detect 244 signal transitions from a low level to a high level or from a high level to a low level, determining the composite trim code delay from the individual trim code delays determined from the two iterations, determining the function to apply to the trim code delays, and/or the like. In so doing, error adjustment logic 228 is coupled to and communicates with state machine 226 and memory mapped registers 230.

Memory mapped registers 230 are coupled to and communicate with state machine 226 and error adjustment logic 228. One or more processors 234 write data values to and read data values from memory mapped registers 230 via the software interface 232. The software interface 232 is implemented via a communications bus. The one or more processors 234 can include CPU 102, an accelerator, a microcontroller included in the CPU 102 or an accelerator, and/or the like.

Memory mapped registers 230 store parameters that provide user defined control for fine tuning calibration circuit 200 based on silicon manufacturing results and/or process results for a particular batch of devices manufactured at the same time. In general, each of the devices included in a particular batch of devices have similar characteristics with respect to process variation. However, characteristics for one batch of devices can differ from the characteristics for a different batch of devices. Additionally, the software interface provides a configurable algorithm which can be changed in silicon based on HBM interface training results.

More particularly, one or more processors 234 store parameters in memory mapped registers 230 via the software interface 232 that control various aspects of calibration circuit 200. In one example, one or more parameters in memory mapped registers 230 control aspects of phase filter 224. The one or more parameters can specify the number of samples of the phase detect 222 signal taken by the phase filter 224 and the filter function employed by phase filter 224. In another example, one or more parameters in memory mapped registers 230 control aspects of state machine 226. The one or more parameters can specify whether state machine calibrates the high phase of the clock signal first or whether state machine calibrates the low phase of the clock signal first. The one or more parameters can specify the function that state machine 226 applies to the trim code delays determined from the two iterations in order to determine the composite trim code delay. The function can be a simple average determined by adding the two trim code delays and dividing the sum by two. Additionally or alternatively, the function can be a weighted average of the two trim code delays, such as ⅓ of the high phase trim code delay plus ⅔ of the low phase trim code delay. Additionally or alternatively, the function can be a geometric mean determined by multiplying the two trim code delays and determining the square root of the result, and so on.

In some examples, the duty cycle distortion is systemic and static. Such examples include systems where the effects of process variations are the dominant factor that determines duty cycle distortion and the effects of voltage and temperature are relatively small. In such examples, the disclosed techniques can be performed once when the system is powered up, when the system exits an idle state, and/or the like. State machine 226 performs two calibration cycles for the two phases of the clock cycle. State machine 226 generates the composite trim code delay based on the trim code delays determined from the two iterations. The composite trim code delay remains fixed during the time that the system remains powered up and active.

In some examples, the duty cycle distortion is dynamic and varies over time. Such examples include systems where the effects of voltage and temperature variations are significant instead of or in addition to the effects of process variations. In such examples, the disclosed techniques can be performed once when the system is powered up, when the system exits an idle state, and/or the like, as described above. In addition, the disclosed techniques can be performed periodically to adjust the composite trim code delay in response to changes in the duty cycle distortion over time. The disclosed techniques can be performed on a periodic basis at a set interval of time, such as a fixed number of microseconds, a fixed number of milliseconds, and/or the like. Additionally or alternatively, the disclosed techniques can be performed continuously by alternating iterations of high phase calibration iterations with low phase calibration iterations. In this manner, changes in both the high phase of the clock signal and low phase of the clock signal are sampled over a rolling window, and the periodic variation of the clock signal is tracked over time. The mode of the calibration circuit 200, such as calibrate once, calibrate periodically at a set interval of time, or calibrate continuously, can be programmable via the software interface 232, such that the interval of time can be stored in memory mapped registers 230. Further, the interval of time for periodic calibration can be programmable via the software interface 232, such that the interval of time can be stored in memory mapped registers 230.

Figure 3:
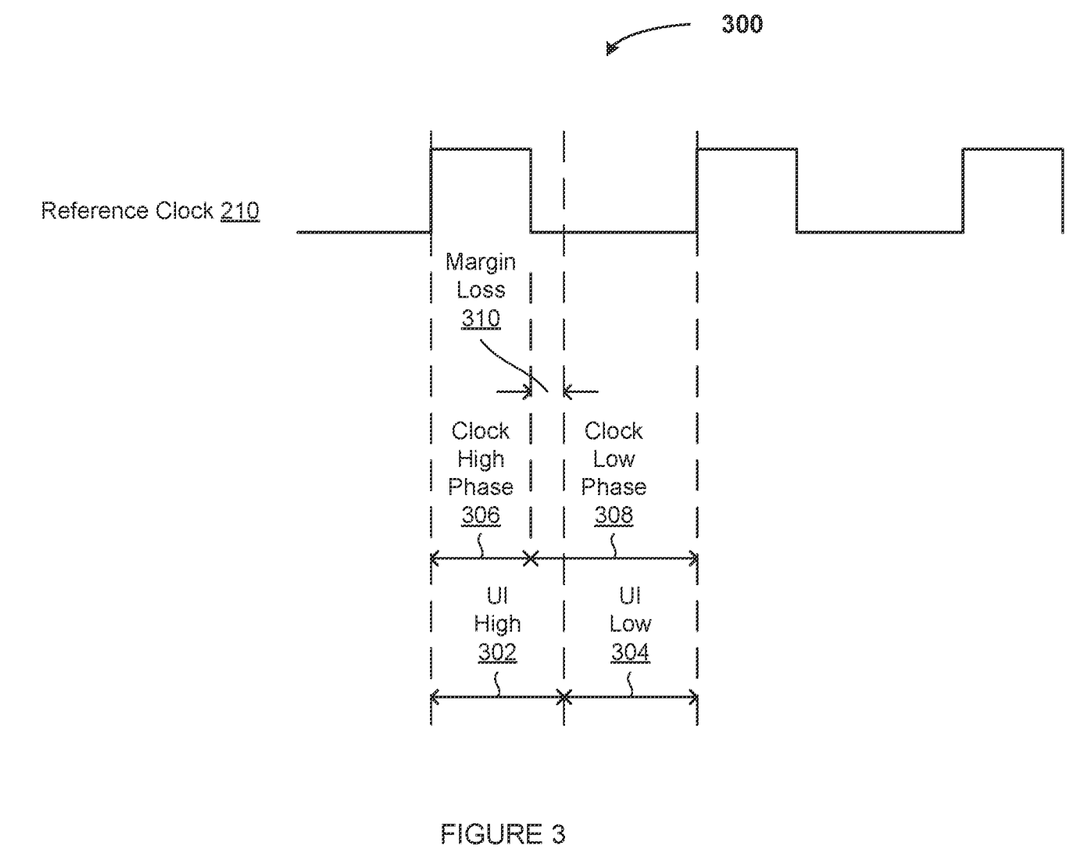
FIG. 3 is a timing diagram illustrating a reference clock signal with duty cycle distortion, according to various embodiments.

FIG. 3 is a timing diagram 300 illustrating a reference clock 210 signal with duty cycle distortion, according to various embodiments. As shown, the reference clock 210 signal is divided into two nominal phases, where each of these two nominal phases have a duration one unit interval (UI) and each UI is 50% of the period of the reference clock 210 signal. One phase of the reference clock 210 signal is a high phase, and the corresponding UI is shown as UI high 302. The other phase of the reference clock 210 signal is a low phase, and the corresponding UI is shown as UI low 304. When the reference clock 210 signal is subject to duty cycle distortion, the duration of the clock high phase 306 is less than or more than the duration of UI high 302. Correspondingly, the duration of the clock low phase 308 is more than or less than the duration of UI low 304.

As shown, the duration of the clock high phase 306 is less than the duration of UI high 302. The difference between the duration of UI high 302 and the duration of the clock high phase 306 represents a margin loss 310. If the calibration circuit 200 calibrates only during the clock high phase 306, then the resulting trim code delay can have a calibration error corresponding to the margin loss 310. Correspondingly, the duration of the clock low phase 308 is more than the duration of UI low 304. The difference between the clock low phase 308 and the duration of UI low 304 represents a margin loss 310. If the calibration circuit 200 calibrates only during the clock low phase 308, then the resulting trim code delay can have a calibration error corresponding to the margin loss 310. Instead, with the disclosed techniques, the calibration circuit 200 calibrates during both the clock high phase 306 and the clock low phase 308 and determines a composite trim code delay therefrom. As a result, the calibration circuit 200 calibrates over a duration that effectively includes both the duration of UI high 302 and the duration of UI low 304, thereby reducing or eliminating the calibration error due to the margin loss 310.

Figure 4:
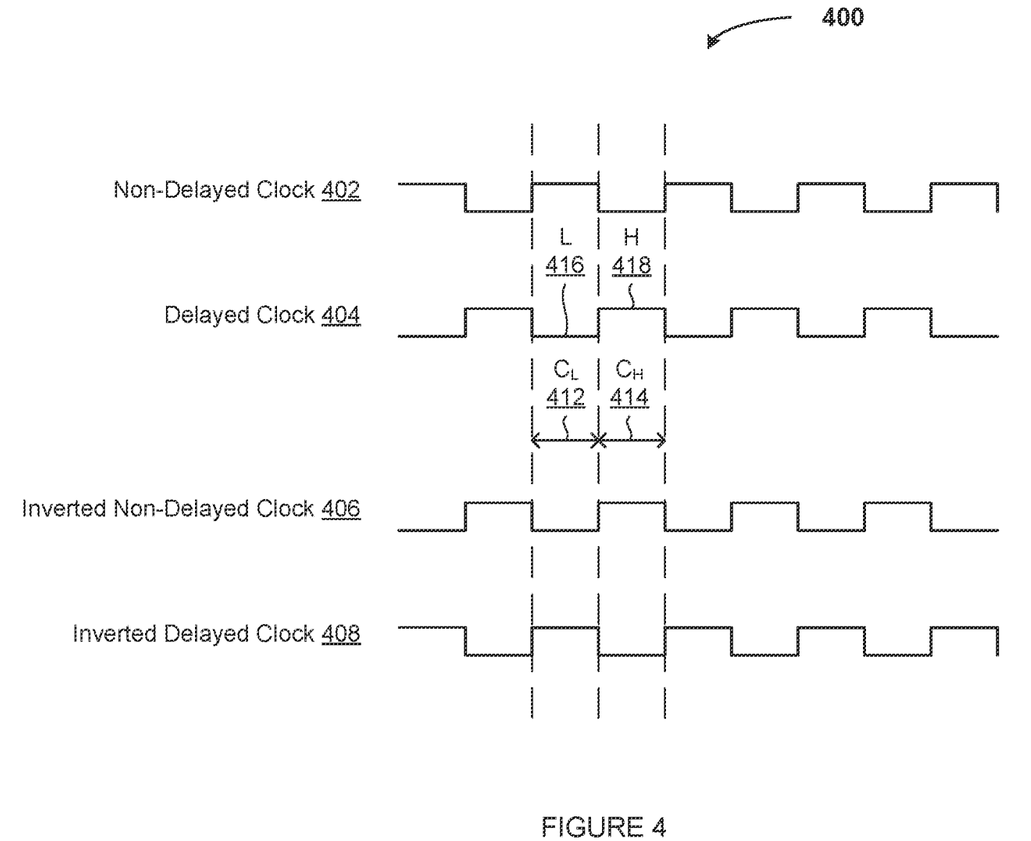
FIG. 4 is a timing diagram illustrating clock signals that have been calibrated by the calibration circuit of FIG. 2, according to various embodiments.

FIG. 4 is a timing diagram 400 illustrating clock signals that have been calibrated by the calibration circuit 200 of FIG. 2, according to various embodiments. As shown, the timing diagram 400 includes a non-delayed clock 402 signal and a delayed clock 404 signal. The non-delayed clock 402 signal represents the non-delayed clock 218 signal of FIG. 2 when the phase select 240 signal causes multiplexor 202 to select the input clock signal CLKP 204. Similarly, the delayed clock 404 signal represents the delayed clock 216 signal of FIG. 2 when the phase select 240 signal causes multiplexor 202 to select the input clock signal CLKP 204. Further, the timing diagram 400 includes an inverted non-delayed clock 406 signal and an inverted delayed clock 408 signal. The inverted non-delayed clock 406 signal represents the non-delayed clock 218 signal of FIG. 2 when the phase select 240 signal causes multiplexor 202 to select the inverted input clock signal CLKN 206. Similarly, the inverted delayed clock 408 signal represents the delayed clock 216 signal of FIG. 2 when the phase select 240 signal causes multiplexor 202 to select the inverted input clock signal CLKN 206.

For any of the non-delayed clock 402 signal, the delayed clock 404 signal, the inverted non-delayed clock 406 signal, and the inverted delayed clock 408 signal, L 416 represents the low clock phases pulse-width and H 418 represents the high clock phase pulse-width. When calibrating delay line 212, calibration circuit 200 determines trim code delays during a low phase calibration iteration and a high phase calibration iteration. $C_L$ 412 represents the trim code delay determined during the low phase calibration iteration. $C_H$ 414 represents the trim code delay determined during the high phase calibration iteration.

When calibrating delay line 212, calibration circuit 200 further takes insertion delays into account. In that regard, $I_D$ (not shown) represents the insertion delay of delay line 212 when the tap select 242 signal is 0, and delay line 212 selects no taps of delay. Further, $I_N$ (not shown) represents the insertion delay through the insertion delay 214 element on the non-delayed path.

Given these definitions, L 416 can be determined via the equation $L=I_D+C_L-I_N$. Similarly, H 418 can be determined via the equation $H=I_D+C_H-I_N$. In some examples, the insertion delay of delay line 212 when the tap select 242 signal is 0 is nominally equal to the insertion delay on the non-delayed path, represented by insertion delay 214 element. This relationship can be represented by the equation $I_D=I_N$. In such examples, L 416 can be determined via the simplified equation $L=C_L$, and H 418 can be determined via the simplified equation $H=C_H$.

Calibration circuit 200 determines a composite calibration trim code delay $C_{CAL}$ based on $C_L$ 412, the trim code delay determined during the low phase calibration iteration, and $C_H$ 414, the trim code delay determined during the high phase calibration iteration. In some examples, calibration circuit 200 determines a composite calibration trim code delay $C_{CAL}$ based on a simple average of $C_L$ 412 and $C_H$ 414. In such examples, the composite calibration trim code delay can be determined via the equation $C_{CAL}=(C_L+C_H)/2$. Additionally or alternatively, calibration circuit 200 determines a composite calibration trim code delay $C_{CAL}$ based on a weighted average of $C_L$ 412 and $C_H$ 414, a geometric average of $C_L$ 412 and $C_H$ 414, and/or the like.

The duration of the unit interval (UI) is also based on the low phase calibration iteration and the high phase calibration. The duration of the UI can be determined via the equation 1 $UI=(L+H)/2=[(C_L+C_H)/2]+I_D-I_N$. In examples where $I_D=I_N$, the duration of the UI can be determined via the simplified equation 1 $UI=(L+H)/2=(C_L+C_H)/2$.

Figure 5:
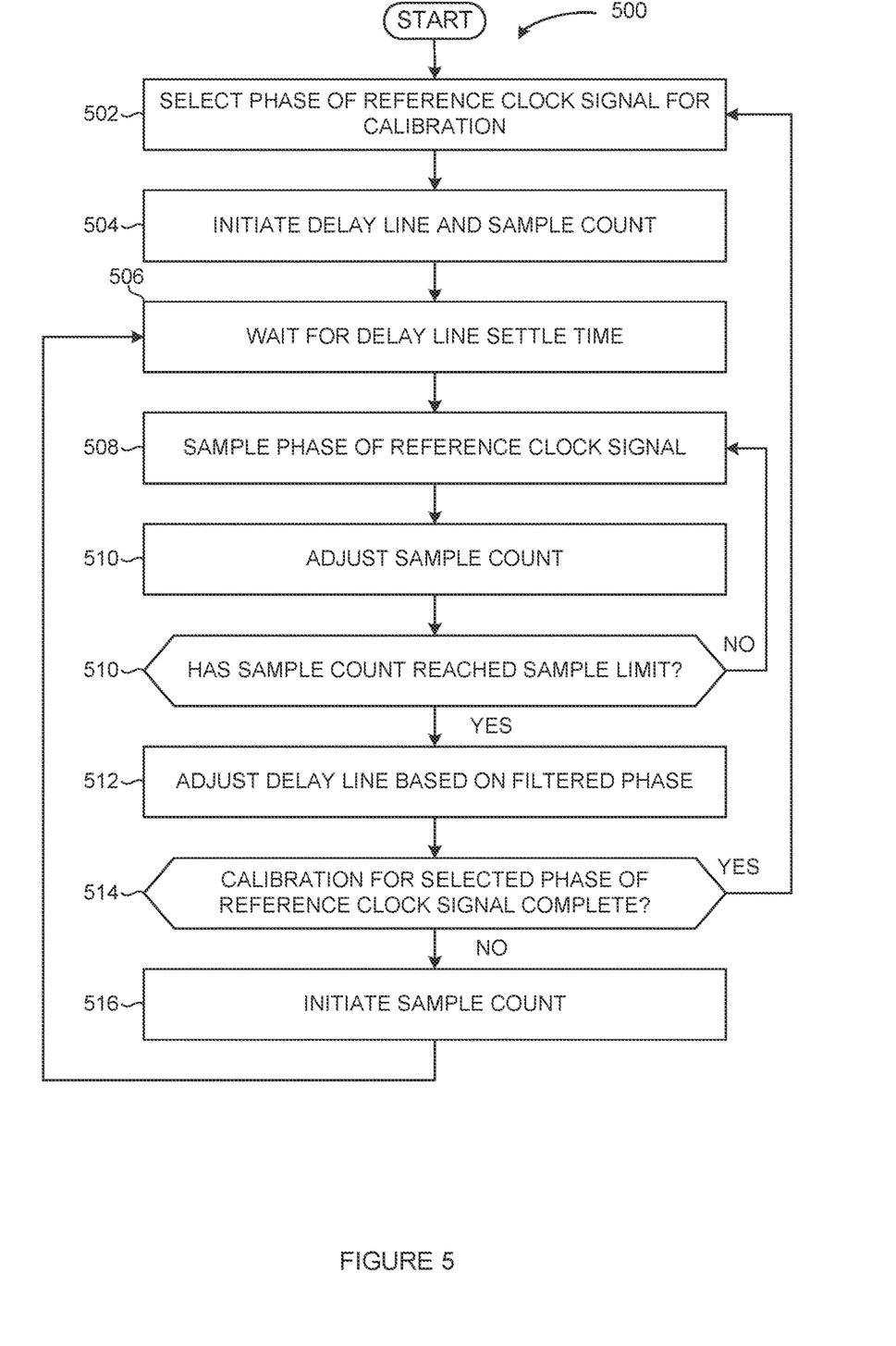
FIG. 5 is a flow diagram of method steps for calibrating a delay line for a memory device included in system memory and/or parallel processing memory of the computer system of FIG. 1, according to various embodiments.

FIG. 5 is a flow diagram of method steps for calibrating a delay line for a memory device included in system memory 104 and/or parallel processing memory 134 of the computer system 100 of FIG. 1, according to various embodiments. Although the method steps are described in conjunction with the systems of FIGS. 1-4, persons of ordinary skill in the art will understand that any system configured to perform the method steps, in any order, is within the scope of the present disclosure.

As shown, a method 500 begins at step 502, where a state machine 226 included in a calibration circuit 200 selects a phase of the reference clock 210 signal for calibration. State machine 226 transmits a phase select 240 signal to a multiplexor 202 with a logic level that is based on which phase of the clock signal that calibration circuit 200 is currently measuring. Multiplexor 202 selects an input clock signal CLKP 204 or an inverted input clock signal CLKN 206 based on the phase select 240 signal.

At step 504, state machine 226 initiates a delay line 212 and initiates a sample count for a phase filter 224. State machine 226 initiates delay line 212 by selecting a starting value for a tap select 242 signal. The starting tap value for the tap select 242 signal can be a default value, a value determined during a prior calibration operation, and/or the like. State machine 226 transmits the tap select 242 signal to delay line 212. Delay line 212, in turn, delays the reference clock 210 signal based on the number of taps specified by the tap select 242 signal.

Further, state machine 226 initiates the sample count for a phase filter 224. Phase filter 224 samples the phase detect 222 signal multiple times. Phase filter 224 generates a filtered phase detect 244 signal by applying an arithmetic average function, a weighted average function, a geometric average function, and/or other filtering functions on the samples of the phase detect 222 signal. Phase filter 224 generates the filtered phase detect 244 signal in order to reduce the effects of spurious signals, noise, and/or the like that may be present in the phase detect 222 signal. The number of samples and the filter function can be programmable via a software interface 232. In some examples, state machine 226 initiates the sample count for phase filter 224 to zero and increments the sample count to a maximum sample count over a number of sample cycles. Alternatively, state machine 226 initiates the sample count for phase filter 224 to a maximum sample count and decrements the sample count to zero over the number of sample cycles.

At step 506, state machine 226 waits for the delay line 212 settle time. When state machine 226 initializes delay line 212 in step 504, delay line 212 changes the amount by which the reference clock 210 signal is delayed. More specifically, delay line 212 transitions from delaying the reference clock 210 signal based on the previous value of the tap select 242 signal to delaying the reference clock 210 signal based on the current value of the tap select 242 signal. During the transition, the delayed clock 216 signal transmitted by delay line 212 can be unstable. State machine 226 waits for the delay line 212 settle time to ensure that the transition is complete and that the delayed clock 216 signal is stable.

At step 508, state machine 226 samples the phase of the delayed clock 216 signal. A D flip-flop 220 samples the phase of the delayed clock 216 signal on a transition of the non-delayed clock 218 signal. The transition can be the rising edge of the non-delayed clock 218 signal or the falling edge of the non-delayed clock 218 signal. D flip-flop 220 generates a phase detect 222 signal that represents the sampled phase of the delayed clock 216 signal. D flip-flop 220 transmits the phase detect 222 signal to phase filter 224. Phase filter 224 stores the sampled state of the phase detect 222 signal.

At step 510, state machine 226 adjusts the value of the sample count. If state machine 226 initiated the sample count to zero in step 504, then state machine 226 increments the sample count. If state machine 226 initiated the sample count to the maximum sample count in step 504, then state machine 226 decrements the sample count.

At step 510, state machine 226 determines whether the sample count has reached the sample limit. If state machine 226 initiated the sample count to zero in step 504, then state machine 226 determines whether the sample count has reached the maximum sample count. If state machine 226 initiated the sample count to the maximum sample count in step 504, then state machine 226 determines whether the sample count has reached zero. If the sample count has not reached the sample limit, then the method proceeds to step 508, described above.

If, on the other hand, the sample count has reached the sample limit, then the method 500 proceeds to step 512, where state machine 226 adjusts the delay line based on the filtered phase samples stored by the phase filter 224. Phase filter 224 transmits a filtered phase detect 244 signal to state machine 226 based on the stored filtered phase samples. Phase filter 224 generates the filtered phase detect 244 signal by applying a filter function to a set of samples of the phase detect 222 signal, where the phase detect 222 signal is a sample of the delayed clock 216 signal. The function can be an arithmetic average function, a weighted average function, a geometric average function, and/or other filtering functions on the samples of the phase detect 222 signal. State machine 226 changes the tap select 242 signal over a number of cycles of the reference clock 210 signal in order to select a different number of taps for delay line 212.

At step 514, state machine 226 determines whether the calibration operation for the clock phase selected in step 502 is complete. For each different number of taps for delay line 212, state machine 226 determines the value of the tap select 242 signal when the filtered phase detect 244 signal transitions from a low level to a high level. Likewise, state machine 226 determines the value of the tap select 242 signal when the filtered phase detect 244 signal transitions from a high level to a low level. State machine 226 determines the trim code delay of the clock phase selected in step 502 based on these two values of the tap select 242 signal. The calibration operation for the clock phase selected in step 502 is complete when state machine 226 has iterated through steps 506 through 516 sufficiently in order to determine the trim code delay.

If, at step 514, the calibration operation for the clock phase selected in step 502 is not complete, then the method 500 proceeds to step 516, where state machine 226 initializes the sample count for phase filter 224, as described in conjunction with step 504. The method then proceeds to step 506, described above.

If, on the other hand, the calibration operation for the clock phase selected in step 502 is complete, then the method proceeds to step 502, where state machine 226 selects a different phase of the reference clock for calibration. In so doing, state machine 226 transmits a phase select 240 signal to a multiplexor 202 with a logic level that is based on which phase of the clock signal that calibration circuit 200 is currently measuring. If, during the prior calibration, multiplexor 202 selected the input clock signal CLKP 204 for calibration, then state machine 226 transmits a phase select 240 signal to cause multiplexor 202 to select the inverted input clock signal CLKN 206. Similarly, if during the prior calibration, multiplexor 202 selected the inverted input clock signal CLKN 206 for calibration, then state machine 226 transmits a phase select 240 signal to cause multiplexor 202 to select the input clock signal CLKP 204.

State machine 226 completes the two iterations of the calibration operating of steps 502 through 516 to calibrate for both phases of the reference clock 210 signal. State machine 226 determines a composite trim code delay by applying a function to the trim code delays determined from the two iterations of the calibration operation. The function to determine the composite trim code delay can be based on a simple average of the trim code delays for the two phases, a weighted average of the trim code delays, a geometric mean of the trim code delays, and/or the like. In some examples, the function is programmable via the software interface 232. Because the composite trim code delay is based on trim code delays for both phases of the clock signal, the error term due to duty cycle distortion is reduced, relative to techniques that calibrate for only one phase of the clock cycle.

In some examples, steps 502 through 516 can be performed once for each phase of the reference clock 210 signal when the system is powered up, when the system exits an idle state, and/or the like. The composite trim code delay remains fixed during the time that the system remains powered up and active. Additionally or alternatively, steps 502 through 516 can be performed periodically to adjust the composite trim code delay in response to changes in the duty cycle distortion over time. Additionally or alternatively, steps 502 through 516 can be performed continuously by alternating iterations of high phase calibration iterations with low phase calibration iterations. In this manner, changes in both the high phase of the clock signal and low phase of the clock signal are sampled over a rolling window, and the periodic variation is tracked over time.

In sum, various embodiments include an improved calibration circuit for a memory device, such as an HBM DRAM device. Memory device I/Os include delay lines for adjusting the delay in the memory input/output I/O signal path. The delay adjustment circuitry includes digital delay lines for adjusting this delay. Further, each digital delay line is calibrated via a digital delay line locked loop (DDLL) which enables adjustment of the delay through the digital delay line in fractions of a unit interval across PVT variations. The disclosed techniques calibrate the digital delay lines by measuring both the high phase and the low phase of the clock signal. As a result, the disclosed techniques compensate for duty cycle distortion by combining the calibration results from both phases of the clock signal.

At least one technical advantage of the disclosed techniques relative to the prior art is that, with the disclosed techniques, both phases of the clock signal are measured when the delay lines for the I/Os of the memory device are adjusted. As a result, the calibration of the delay lines is based on a more accurate measurement of the full clock cycle period relative to prior techniques, even when the clock cycle is subject to duty cycle distortion. Because the calibration of the memory device is more accurate, the memory device can operate at higher speeds, leading to improved memory performance relative to prior techniques. Another technical advantage of the disclosed techniques is that digital delay lines spanning one unit interval can be employed to track the clock signal across two unit intervals. As a result, the die area and power consumption are reduced relative to implementations with digital delay lines spanning two unit intervals. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for calibrating a delay line for a memory device, the method comprising:
   selecting a first phase of a reference clock signal;
   determining a first calibration value for the delay line based on the first phase of the reference clock signal;
   selecting a second phase of the reference clock signal;
   determining a second calibration value for the delay line based on the second phase of the reference clock signal; and
   generating a third calibration value for the delay line based on the first calibration value and the second calibration value.

2. The method of claim 1, wherein selecting the first phase of the reference clock signal comprises transmitting a select signal to a multiplexor to select a non-inverted version of the reference clock signal.

3. The method of claim 1, wherein selecting the second phase of the reference clock signal comprises transmitting a select signal to a multiplexor to select an inverted version of the reference clock signal.

4. The method of claim 1, wherein determining the first calibration value comprises sampling a delayed version of the reference clock signal on a transition of a non-delayed version of the reference clock signal.

5. The method of claim 1, wherein determining the first calibration value comprises applying a filter function to a plurality of samples of a delayed version of the reference clock signal.

6. The method of claim 5, wherein the filter function comprises at least one of an arithmetic average function, a weighted average function, or a geometric average function.

7. The method of claim 5, at least one of a number of samples included in the plurality of samples and the filter function is programmed via a software interface.

8. The method of claim 1, wherein generating the third calibration value comprises applying at least one of an arithmetic average function, a weighted average function, or a geometric average function to the first calibration value and the second calibration value.

9. The method of claim 1, wherein the third calibration value is based on at least one of a first insertion delay associated with a delayed version of the reference clock signal and a second insertion delay associated with a non-delayed version of the reference clock signal.

10. The method of claim 9, wherein the third calibration value is based on a difference of the first insertion delay and the second insertion delay.

11. The method of claim 9, wherein the first insertion delay is equal to the second insertion delay.

12. A system, comprising:
a processor;
a delay line; and
a calibration circuit that:
  selects a first phase of a reference clock signal;
  determines a first calibration value for the delay line based on the first phase of the reference clock signal;
  selects a second phase of the reference clock signal;
  determines a second calibration value for the delay line based on the second phase of the reference clock signal; and
  generates a third calibration value for the delay line based on the first calibration value and the second calibration value.

13. The system of claim 12, wherein, to select the first phase of the reference clock signal, the calibration circuit transmits a select signal to a multiplexor to select a non-inverted version of the reference clock signal.

14. The system of claim 12, wherein, to select the second phase of the reference clock signal, the calibration circuit transmits a select signal to a multiplexor to select an inverted version of the reference clock signal.

15. The system of claim 12, wherein, to determine the first calibration value, the calibration circuit samples a delayed version of the reference clock signal on a transition of a non-delayed version of the reference clock signal.

16. The system of claim 12, wherein, to determine the first calibration value, the calibration circuit applies a filter function to a plurality of samples of a delayed version of the reference clock signal.

17. The system of claim 16, wherein the filter function comprises at least one of an arithmetic average function, a weighted average function, or a geometric average function.

18. The system of claim 16, at least one of a number of samples included in the plurality of samples and the filter function is programmed via a software interface.

19. The system of claim 12, wherein, to generate the third calibration value, the calibration circuit applies at least one of an arithmetic average function, a weighted average function, or a geometric average function to the first calibration value and the second calibration value.

20. The system of claim 12, wherein the third calibration value is based on at least one of a first insertion delay associated with a delayed version of the reference clock signal and a second insertion delay associated with a non-delayed version of the reference clock signal.

\* \* \* \* \*